United States Patent [19]
Deamer

[11] Patent Number: 5,802,713
[45] Date of Patent: Sep. 8, 1998

[54] CIRCUIT BOARD MANUFACTURING METHOD

[75] Inventor: Kerry L. Deamer, Germantown, Md.

[73] Assignee: Fairchild Space and Defense Corportion, Germantown, Md.

[21] Appl. No.: 659,556

[22] Filed: Jun. 6, 1996

Related U.S. Application Data

[63] Continuation of Ser. No. 375,652, Jan. 20, 1995, abandoned.

[51] Int. Cl.$^6$ ............................... H05K 3/28; H05K 3/46
[52] U.S. Cl. ................................. 29/846; 29/830; 29/840; 29/852; 174/260; 174/262; 228/179.1; 427/97
[58] Field of Search .............................. 29/829, 830, 837, 29/846, 424, 840, 852; 430/313, 314; 228/179.1, 180.21; 174/260, 262; 156/307.1, 87; 427/97

[56] References Cited

U.S. PATENT DOCUMENTS

| | | | |
|---|---|---|---|
| 3,868,770 | 3/1975 | Davis et al. | 29/837 |
| 3,934,334 | 1/1976 | Hanni | 29/846 X |
| 4,064,287 | 12/1977 | Lipson et al. | 29/424 X |
| 4,113,550 | 9/1978 | Saiki et al. | 430/313 |
| 4,195,997 | 4/1980 | Graham | 430/306 X |
| 4,806,200 | 2/1989 | Larson et al. | 29/847 |
| 4,872,937 | 10/1989 | Gouldy | 29/837 X |
| 4,908,096 | 3/1990 | Zupancic | 430/313 X |
| 5,144,742 | 9/1992 | Lucas et al. | 29/830 |
| 5,433,368 | 7/1995 | Spigarelli | 228/8 |

*Primary Examiner*—Peter Vo
*Attorney, Agent, or Firm*—Michael W. York

[57] ABSTRACT

A circuit board manufacturing method for manufacturing a printed circuit board with improved characteristics for machine soldering. The circuit board manufacturing method includes the addition of a polyimide "B" semicured material to a printed circuit board prior to preheating and then machine soldering the printed circuit board. The polyimide "B" semicured material retards heat and is used to eliminate the common "hot" and "cold" spots that occur with printed circuit boards during the preheat cycle prior to machine soldering of the printed circuit board. As a result of the heat retardation due to the polyimide "B" state material the circuit board is thoroughly and properly heated during the preheat cycle to eliminate hot and cold spots so that proper machine soldering can occur. A number of different methods are presented and in one method polyimide "B" stage material is used to prevent movement of thermal pads.

3 Claims, 8 Drawing Sheets

CIRCUIT BOARD MANUFACTURING METHOD

This application is a continuation of application Ser. No. 08/375,652, filed Jan. 20, 1995, now abandoned.

BACKGROUND OF THE INVENTION

Printed circuit boards are in wide use in all types of electronic equipment. However, in spite of their wide spread use there is still a basic problem associated with printed circuit boards and that is how to economically populate and solder electronic components into a printed circuit board. Some of the problems associated with economically populating and soldering electronic components into printed circuit boards include complex or poor wiring board designs, the masking off of areas that must be protected during machine soldering and the need to resolder defective solder joints after machine soldering. Other problems include the need to resolder defective solder joints after machine soldering. Other problems include the need to rework components due to the movement of thermal conductive material under high heat generating components, the need to manually place and hard solder components and electronic noise caused by a poor surface coating or no coating on the circuit board. In view of these problems, it is estimated that an average of over two man hours are needed per printed wiring circuit board to correct or compensate for these problems. Consequently, such problems have a significant effect upon the economical population and soldering of printed wiring circuit boards and a definite need exists for overcoming these problems.

There are also a number of practical considerations when considering changes to the method for manufacture of printed circuit boards or to the composition of printed circuit boards. First of all, the proposed changes should not cause the resulting printed circuit board to not meet standard contractual requirements such as military specifications (Mil-Specs). In this connection, any additional materials that are proposed to be added to the printed circuit board should already meet standard contractual requirements such as Mil-Specs. If this is not done the requirement to requalify the material or the printed circuit board may well make any proposed changes uneconomical.

From a manufacturing viewpoint, any covering material must be able to hold in heat absorbed from the usual machine soldering preheat cycle. In addition, the material cannot distort, move, blister, delaminate or otherwise be affected by machine soldering. The material must be compatible with all printed circuit board manufacturing processes. The material must make a permanent bond with any circuit board base material and any attached metal-clad material and the material must be malleable where specific cutouts or buildups are required. Finally, it is important that the costs for reworking existing designs or incorporating any proposed material into new designs must be reasonable with a high benefit to cost ratio.

A huge portion of the problems associated with current printed wiring circuit boards can be traced to the fact that there will be hot or cold areas on the printed circuit board. Current printed wiring circuit boards have copper material plated in holes and a copper ground plane that is covered by solder mask or solder coating. When the current printed wiring circuit board is preheated prior to machine soldering heat radiates from the copper and/or solder coating at an uneven rate depending upon the mass of the copper and the board thickness. This creates "hot" and "cold" areas on the printed circuit board and the uneven heat radiation causes variations in transferring solder from the machine through the plated hole to the top of the printed wiring board. This creates problems in the proper soldering of electronic components to the printed circuit board.

This invention overcomes the problem of hot and cold spots on the preheated printed circuit board and allows uniform transfer of solder from the machine through the plated hole to the top of the printed wiring board. Consequently, many of the problems associated with previous printed circuit boards are eliminated or greatly reduced. In addition, this invention uses a material that is already qualified for use on printed circuit boards and meets Mil-specs. Consequently, the resulting printed circuit board meets specifications, including Mil-Specs. The resulting printed circuit board invention allows rapid population and soldering of electronic components in the printed circuit board at a greatly reduced cost and a great reduction in the average number of man hours needed to correct problems with the circuit boards.

BRIEF DESCRIPTION OF THE INVENTION

This invention relates to printed circuit boards and more particularly to a printed circuit board manufacturing method and printed circuit board resulting therefrom that provide for the uniform transfer of solder to the printed circuit board and prevent thermal pad movement.

Accordingly, it is an object of the invention to provide a printed circuit board manufacturing method and resulting printed circuit board that improve the quality of a populated and soldered printed circuit board.

It is an object of the invention to provide a printed circuit board manufacturing method and resulting printed circuit board that reduce the number of defects associated with populated and soldered printed circuit boards.

It is an object of the invention to provide a printed circuit board manufacturing method and resulting printed circuit board that reduce the amount of man hours required to correct defects on the final populated and soldered printed circuit board.

It is an object of the invention to provide a printed circuit board manufacturing method and resulting printed circuit board that provide a printed circuit board that meets standard contractual requirements for circuit boards including Mil-Specs.

It is an object of the invention to provide a printed circuit board manufacturing method that is easy to carry out.

It is an object of the invention to provide a printed circuit board that is easy to manufacture.

It is an object of the invention to provide a printed circuit board manufacturing method that is economical.

It is an object of the invention to provide a printed circuit board that is economical to manufacture.

It is an object of the invention to provide a printed circuit board manufacturing method that uses standard printed circuit board manufacturing equipment.

It is also an object of the invention to provide a printed circuit board that can be manufactured with standard printed circuit based manufacturing equipment.

It is also an object of the invention to provide a printed circuit board manufacturing method that prevents movement of any thermal pads.

These and other objects will be apparent from the invention that includes a method of manufacturing a printed circuit board including the steps of providing means for machine soldering a printed circuit board, providing means for preheating a printed circuit board prior to machine soldering the printed circuit board, providing an un-machine soldered printed circuit board, and providing means to cause uniform heat distribution in an un-machine soldered printed circuit board. The method includes attaching the means to cause uniform heat distribution in an un-machine soldered printed circuit board to the un-machine soldered printed circuit board, using the means to preheat the un-machine soldered printed circuit board to preheat the un-machine soldered printed circuit board and using the means to machine solder a printed circuit board to machine solder the preheated un-machine soldered printed circuit board.

BRIEF DESCRIPTION OF THE INVENTION

The invention will be hereinafter more fully described with reference to the accompanying drawings in which.

DETAILED DESCRIPTION OF THE PREFERRED EMBODIMENT

Figure 1:
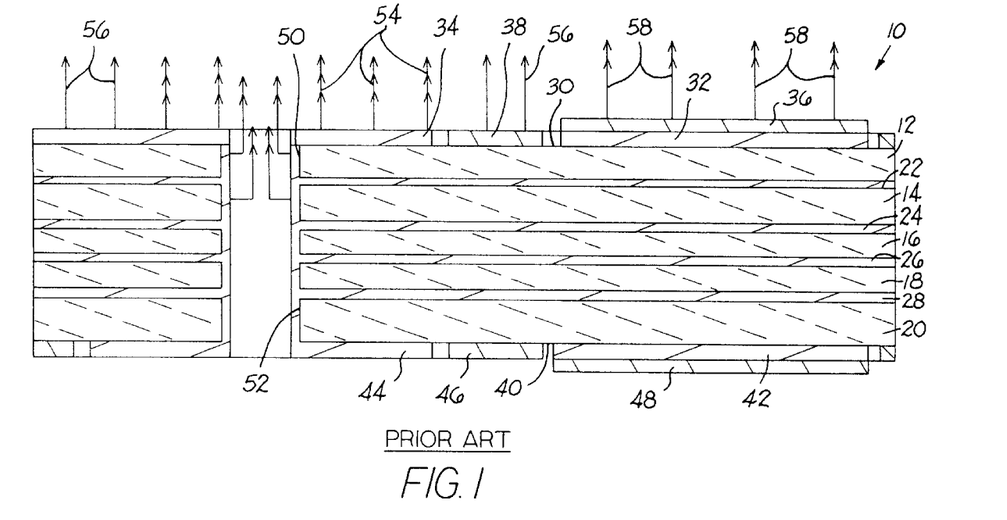
FIG. 1 is a sectional view of a conventional printed circuit board taken substantially through the center of the board illustrating the uneven heat radiation after being preheated.

Referring first to FIG. 1, a prior art printed circuit board is illustrated and is designated generally by the number 10. The prior art printed circuit board 10 is thin and rectangular shaped and comprises five polyimide layers 12, 14, 16, 18 and 20 with four thin copper layers 22, 24, 26, and 28 located between the respective polyimide layers 12 and 14, 14 and 16, 16 and 18, and 18 and 20. The top polyimide layer 12 has an outer surface 30 that is partially covered by several copper layers 32 and 34. The copper layer 32 is also covered by a layer of solder mask 36. Another layer of solder mask 38 is applied directly to the upper surface 30. The lower polyimide layer 20 also has an outer surface 40. This outer undersurface 40 also is partially covered by several copper layers 42 and 44 and a solder mask layer 46. Another solder mask layer 48 is located on the copper layer 42. The layers 42, 44, 46 and 48 are substantially identical to the previously described layers 32, 34, 36 and 38.

As indicated in FIG. 1 the prior art printed circuit board 10 has a substantially circular cross sectional hole 50 extending through it from its upper surface 30 to its lower surface 40. This hole 50 also extends through the copper layers 34 and 44. The hole 50 is plated with a coating of copper 52. FIG. 1 illustrates the typical heat loss or heat radiation pattern from the prior art circuit board 10 after it has been preheated. The arrows with three (3) barbs designated by the number 54 indicated a high rate of heat loss or heat radiation and hence a resulting cool spot or portion in the printed circuit board 10. On the other hand, the arrows with only one (1) barb 56 indicate a very low rate of heat loss or radiation and consequently a resulting hot spot or portion in the printed circuit board 10. The arrows with two (2) barbs 58 indicate a medium size of heat loss or radiation from the printed circuit board 10. As a consequence, it is obvious that there are hot and cold spots in the prior art preheated circuit board 10 that will cause subsequent potential problems with the machine soldering of the printed circuit board 10. This depiction of the the relative heat loss or radiation associated with the number of barbs on the arrows is also true for the arrows with barbs in any of the other figures in this patent application.

Figure 2:
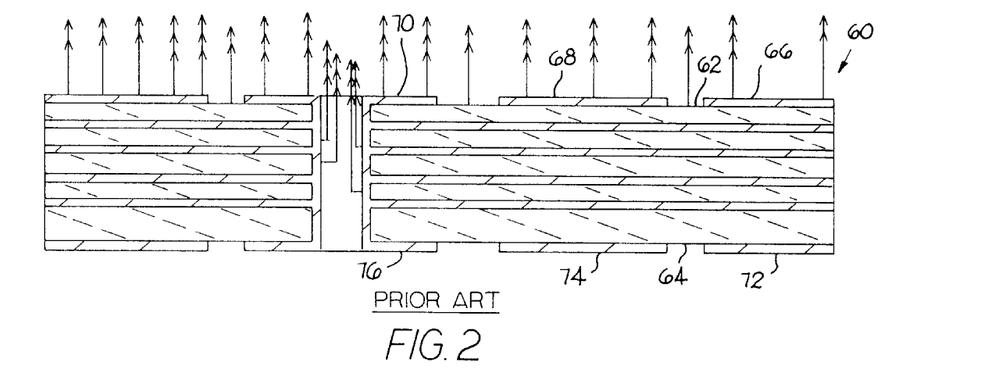
FIG. 2 is a sectional view substantially the same as FIG. 2 but illustrating the uneven heat radiation from another type of conventional printed circuit board.

FIG. 2 illustrates an additional prior art printed circuit board designated generally by the number 60. This prior art printed circuit board 60 is constructed in a manner similar to the previously described prior art printed circuit board 10. However, its upper surface 62 and its lower surface 64 only have copper layers designated by the respective numbers 66, 68, 70, 72, 74 and 76. As indicated, there is no solder mask used with the prior art printed circuit board 60. This printed circuit board 60 also has uneven heat loss or radiation after the printed circuit board 60 is preheated and hence it will have cold and hot spots which will cause problems when it is subsequently machine soldered.

Figure 3:
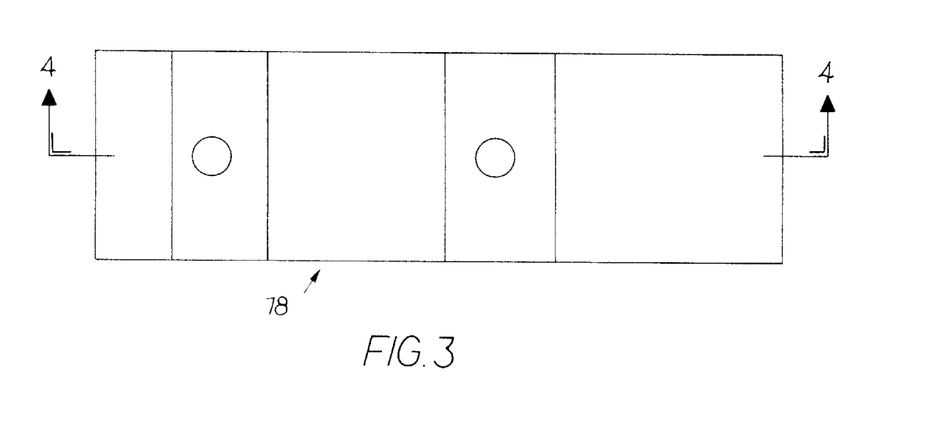
FIG. 3 is a top plan view of one embodiment of the printed circuit board invention.
Figure 4:
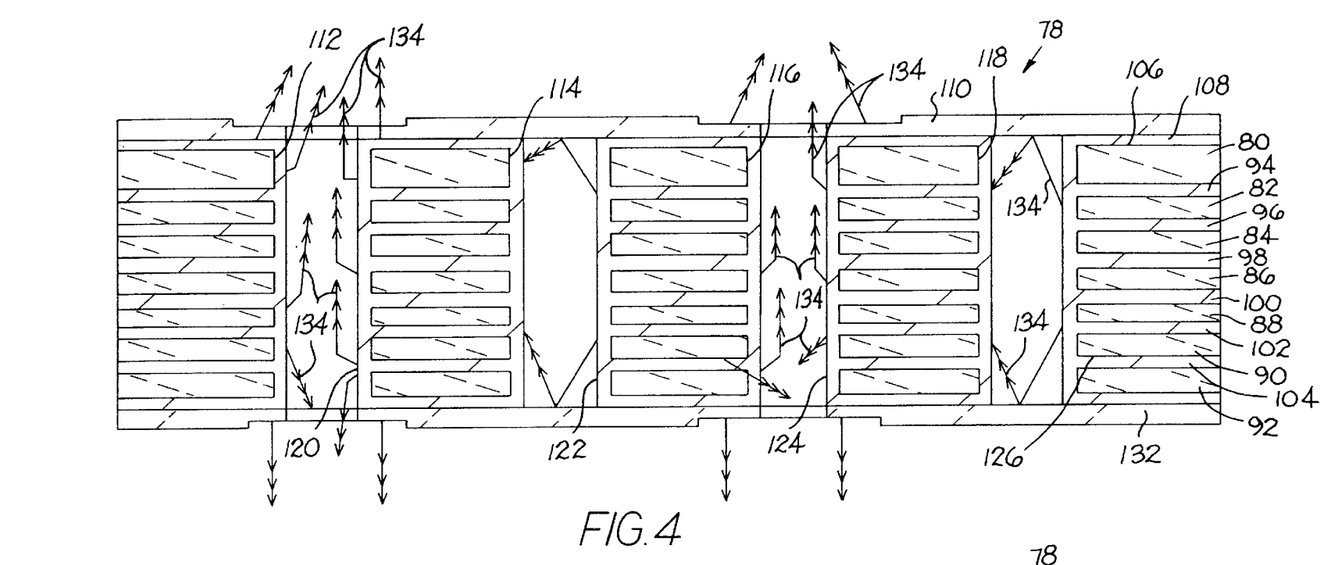
FIG. 4 is an enlarged sectional view taken substantially on the line 4—4 of FIG. 3.
Figure 5:
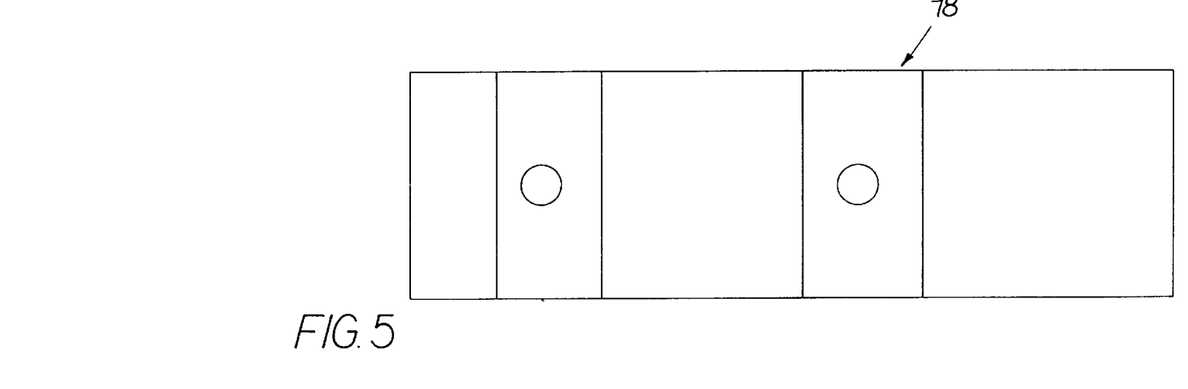
FIG. 5 is a bottom plan view of the printed circuit board invention illustrated in FIGS. 3 and 4.

FIGS. 3, 4 and 5 illustrate one embodiment of the printed circuit board invention that is designated generally by the number 78. The printed circuit board 78 comprises seven layers of polyimide material designated by the numbers 80, 82, 84, 86, 88, 90 and 92 with six thin copper layers 94, 96, 98, 100, 102 and 104 located between the respective polyimide layers 80 and 82, 82 and 84, 84 and 86, 86 and 88, 88 and 90, and 90 and 92. The upper surface 106 of the upper polyimide layer 80 is substantially covered by a thin copper layer 108. This copper layer 108 is then substantially covered by "B" stage polyimide material designated by the number 110 that even covers some of the holes 112, 114, 116, and 118 whose insides are covered by the respective copper coatings 120, 122, 124 and 126. The holes 120 and 124 are component lead holes and are not covered. The outer surface 128 that is substantially covered by a thin layer of copper 130 that in turn is substantially covered by a layer of "B" stage polyimide material 132 that also covers the holes 120 and 124. Consequently, both the top and bottom of the printed circuit board 78 have "B" stage polyimide over copper and are substantially identical in their configurations.

FIG. 4 illustrates the heat flow distribution in the preheated printed circuit board 78. In FIG. 4 the arrows 134 indicate the heat flow paths in the preheated printed circuit board 78. As illustrated, the "B" stage material layers 110 and 132 do not conduct heat but instead retard the conduction of heat and hence as indicated by the arrows 134 heat is forced into or flows into the holes 112 and 116 where solder is intended to flow during the machine soldering of the printed circuit board 78. Also all holes radiating heat will be at substantially the same temperature which is essential to assure uniform and reliable solder joints as a result of the machine soldering operation after preheating of the printed circuit board 78.

Figure 6:
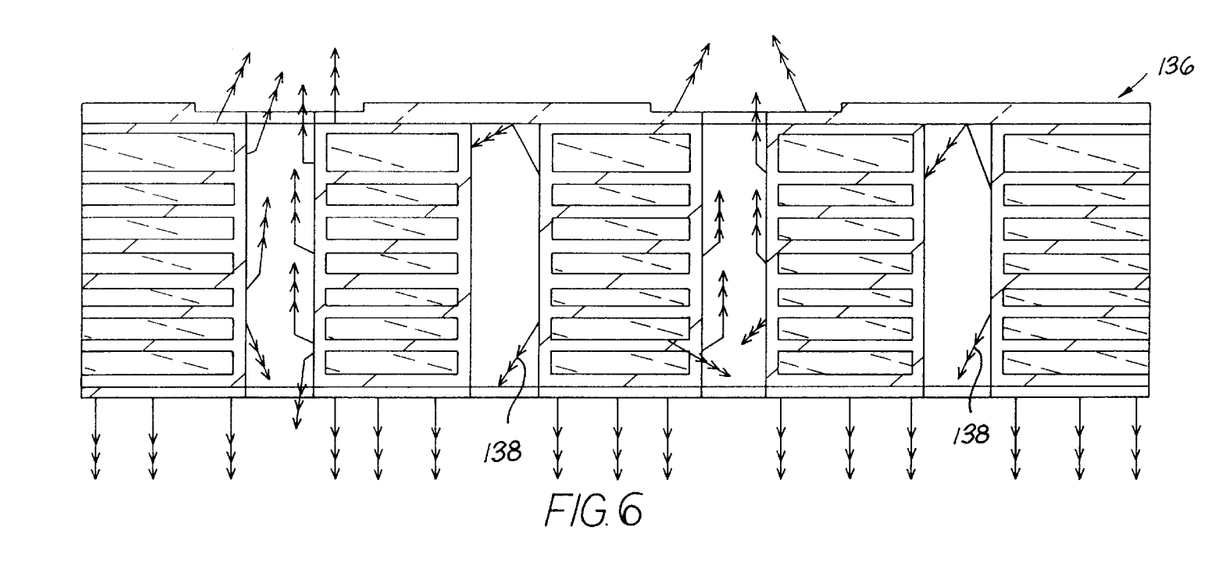
FIG. 6 is a sectional view of another printed circuit board invention embodiment with the section being taken substantially on the same line as the sectional view set forth in FIG. 4.
Figure 7:
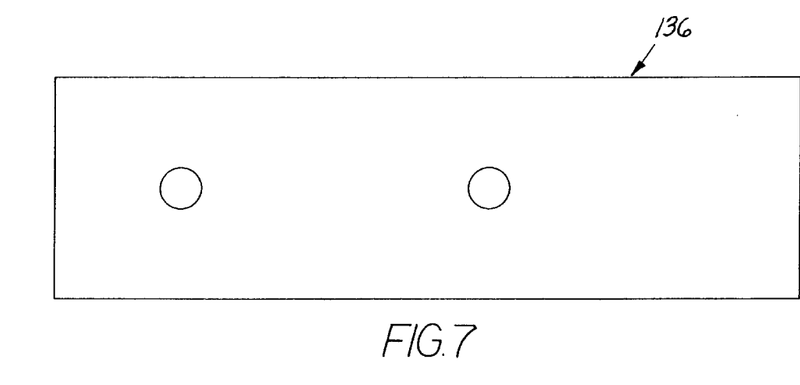
FIG. 7 is a reduced size bottom plan view of the embodiment of the printed circuit board invention illustrated in FIG. 6.

FIGS. 6 and 7 illustrate another embodiment of the printed circuit board invention that is designated generally by the number 136. This printed circuit board embodiment 136 is substantially the same as the embodiment illustrated in FIGS. 3, 4, and 5 and has all the same layers that are configured the same and hence numbered the same as those of the embodiment 78 set forth in FIGS. 3, 4, and 5. However, the printed circuit embodiment 136 does not have the "B" stage material layer 132 on the underside copper layer 130. Instead, the copper layer 130 is exposed. As a result, the preheated printed circuit board 136 has the heat flow distribution indicated by the arrows 138. The resulting heat distribution in the preheated printed circuit board 136 is not as uniform as with the printed circuit board embodiment 78 and the board 136 will not hold its optimum heat profile as long as the embodiment 78. However, the machine soldered preheated board 136 resembles that of a hand soldered board and it is less costly than the current board embodiment 78 set forth in FIGS. 3, 4, and 5.

Figure 8:
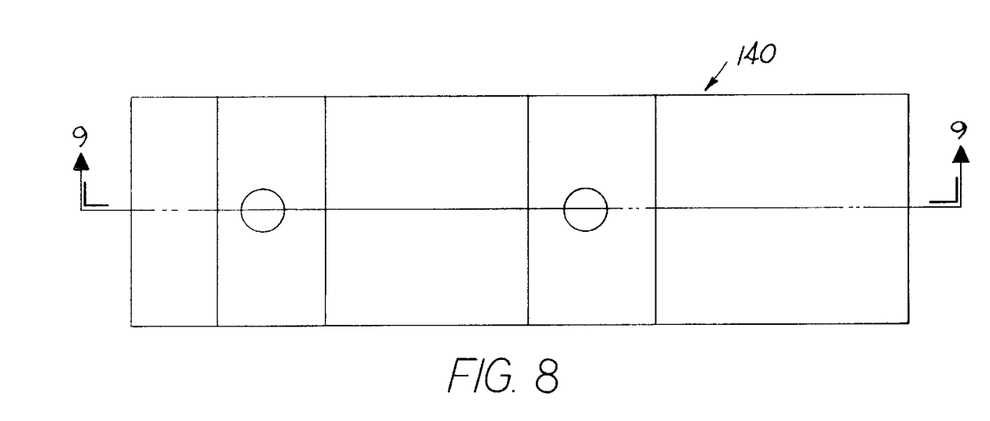
FIG. 8 is a top plan view of an additional embodiment of the printed circuit invention.
Figure 9:
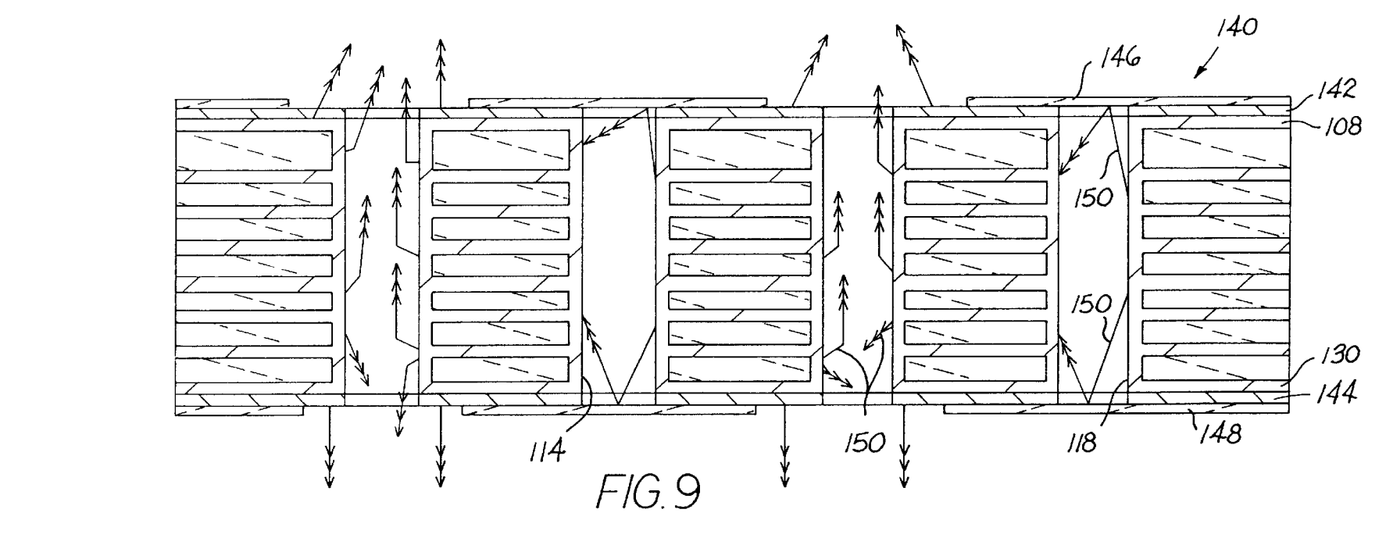
FIG. 9 is an enlarged sectional view of the printed circuit board invention illustrated in FIG. 8 taken substantially on the line 9—9 thereof.
Figure 10:
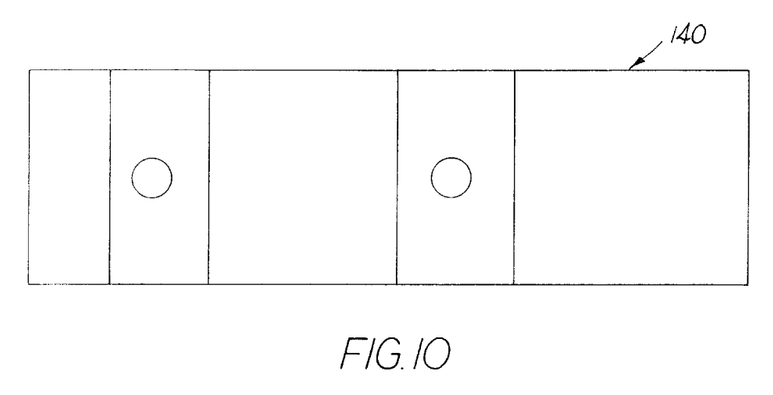
FIG. 10 is a bottom plan view of the printed circuit board invention illustrated in FIGS. 8 and 9.

FIGS. 8, 9, and 10 illustrate a third printed circuit board embodiment designated generally by the number 140. This printed circuit board embodiment 140 has substantially the same basic structure as the printed circuit embodiment 78 set forth in FIGS. 3, 4, and 5. However, both the upper and undersides of the basic structure of the board 78 are coated with soldering coating prior to applying "B" stage polyimide layers. In this connection in the embodiment 140 the copper layer 108 is covered by a solder coating layer 142 and in a similar manner the copper layer 130 is also covered by a solder coating layer 144. These solder coating layers 142 and 144 have their outer surfaces covered by respective layers of "B" stage material 146 and 148. These layers 146 and 148 not only cover the respective solder coating layers 142 and 144 but also the feed through holes 114 and 118.

The resulting heat distribution in the preheated circuit board 140 is illustrated by the arrows designated by the numbers 150. As illustrated, heat is directed as desired to the component feed through holes 112 and 116 of the preheated circuit board 140. In addition, normally molten solder tends to run under conventional solder masks as well as causing the solder mask to crack and flake upon cooling. The running of the solder can also in some cases cause shorting. However, with the "B" stage layers 146 and 148 over the respective solder coating layers 142 and 144, the "B" stage layers 146 and 148 do not crack or flake and they also prevent the running of the solder coating layers 142 and 144 during machine soldering operations. This configuration is excellent for reworking existing printed circuit boards.

Figure 11:
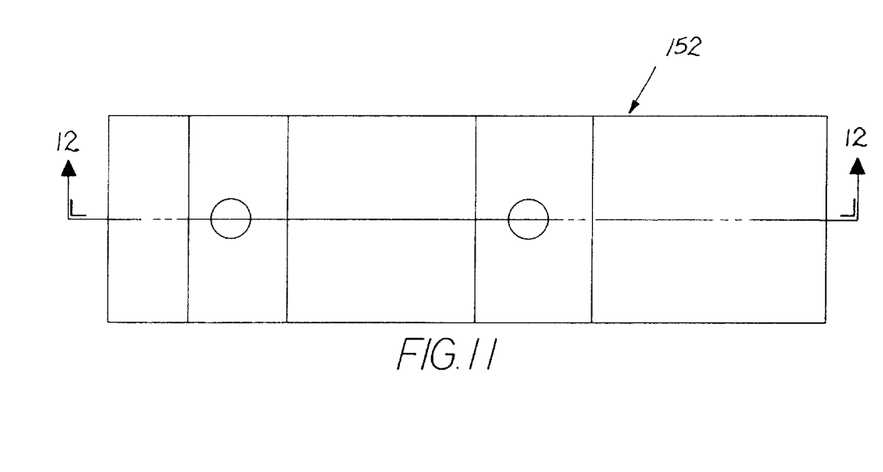
FIG. 11 is a top plan view of an additional embodiment of the printed circuit board invention.
Figure 12:
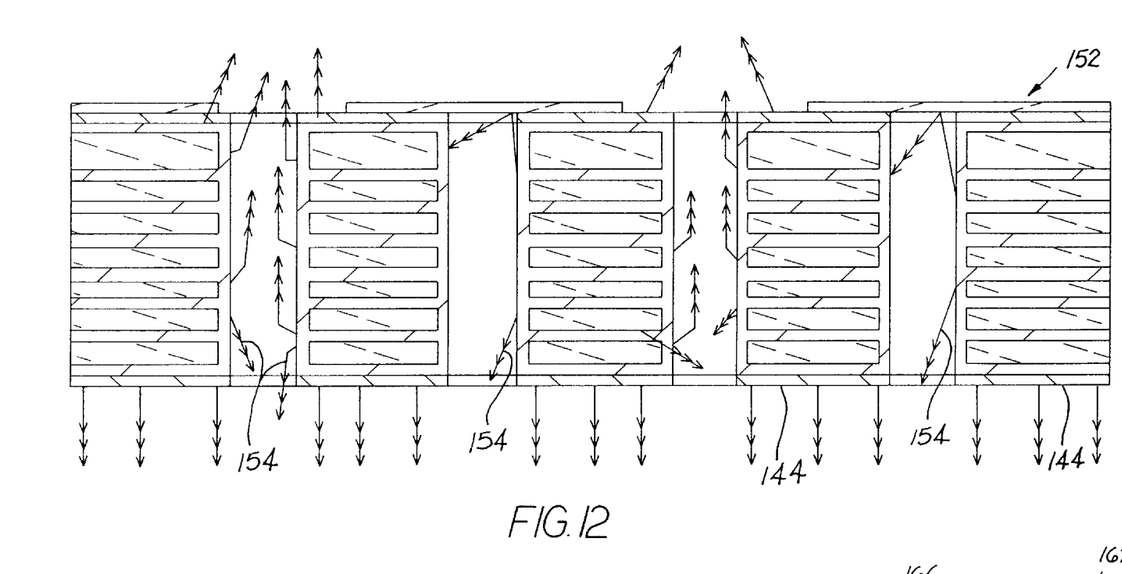
FIG. 12 is an enlarged sectional view of the printed circuit board invention illustrated in FIG. 11 taken substantially on the line 12—12 thereof.

FIGS. 11 and 12 illustrate another printed circuit board embodiment that is designated generally by the number 152. This embodiment 152 is substantially identical to the embodiment 140 set forth in FIGS. 8, 9, and 10 including the solder coating layer 142 and the associated "B" stage material layer 146 that covers the solder coating layer 142. However, there is no covering "B" stage material layer 148 over the solder coating layer 144 on the lower or underside portion of the printed circuit board embodiment 152 as there was with the embodiment 140. The resulting preheated printed circuit board 152 has the heat distribution indicated by the arrows 154. It will be noted that heat is directed to the component holes 112 and 116 but not as effectively as is the case with the embodiment 140. This embodiment 152 is less costly than the embodiment 140. However, this embodiment 152 will not hold the optimum heat profile as long as the embodiment 140. This machine soldering profile of this embodiment 152 is recommended for reworking existing printed circuit boards that have eight layers or less and no ground planes on the bottom side of the printed circuit board.

Figure 13:
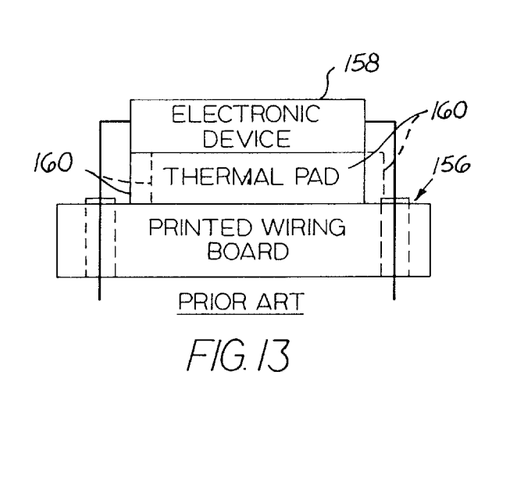
FIG. 13 is a side elevational view of a prior art electronic device with a thermal pad under it that are connected to a printed wiring board illustrating how the thermal pad can move after the printed circuit board is machine soldered and cleaned.

FIG. 13 is a sectional view of a prior art portion of a printed circuit board designated by the number 156 with an electronic device 158 with a thermal pad 160 under it that are both connected to the circuit board portion illustrating how the thermal pad 160 can shift after the circuit board is machine soldered and cleaned. In this connection, the thermal pad 160 with the solid lines illustrates the position of the thermal pad 160 prior to machine soldering and cleaning and the dashed lined thermal pad 160 illustrates the position of the thermal pad after machine soldering of the circuit board portion 156. This results at least in part by the tendency of the thermal pad 160 material swelling and then shrinking during the machine soldering and cleaning operations. As illustrated, in view of the movement of the thermal pad 160, the electronic device 158 is no longer properly protected by the thermal pad 160 that is to conduct heat away from the electronic device 158 to the printed circuit board 156.

Figure 14:
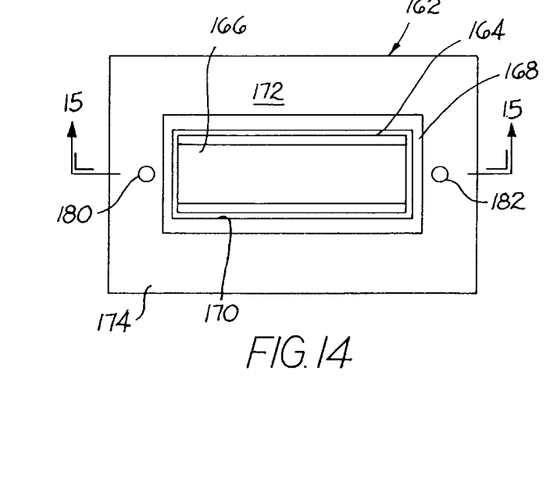
FIG. 14 is a top plan view of another embodiment of the printed circuit board invention illustrating how movement of a thermal pad is prevented.
Figure 15:
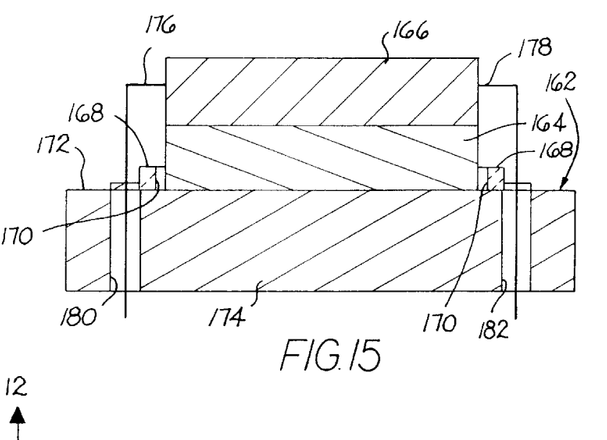
FIG. 15 is an enlarged sectional view of the printed circuit board invention illustrated in FIG. 14 taken substantially on the line 15—15 thereof.

FIGS. 14 and 15 illustrate another embodiment of the printed circuit board invention designated by the number 162 illustrating how movement of a thermal pad 164 located under an electronic device 166 is prevented. In this embodiment 162 a layer of "B" stage polyimide material 168 with an aperture through it 170 that is sized and shaped to receive the thermal pad 164 is secured by being laminated to the upper side 172 of the circuit board 174. This layer of "B" stage polyimide material layer 168 is between 0.002 inch and 0.01 inch thick and in the preferred embodiment it is substantially 0.004 inch thick. This "B" stage polyimide material layer 168 with its aperture 170 forms a fence or barrier around the thermal pad 164 that prevents any substantial movement of the thermal pad 164 during machine soldering and the subsequent cleaning of the printed circuit board combination 162. The electronic device 166 is then placed over the thermal pad and its leads 176 and 178 are inserted into the plated holes 180 and 182. Since it takes some twenty to thirty minutes to rework a printed circuit board where a thermal pad has moved a substantial amount of time and expenses is saved through the use of this embodiment 162.

Figure 16:
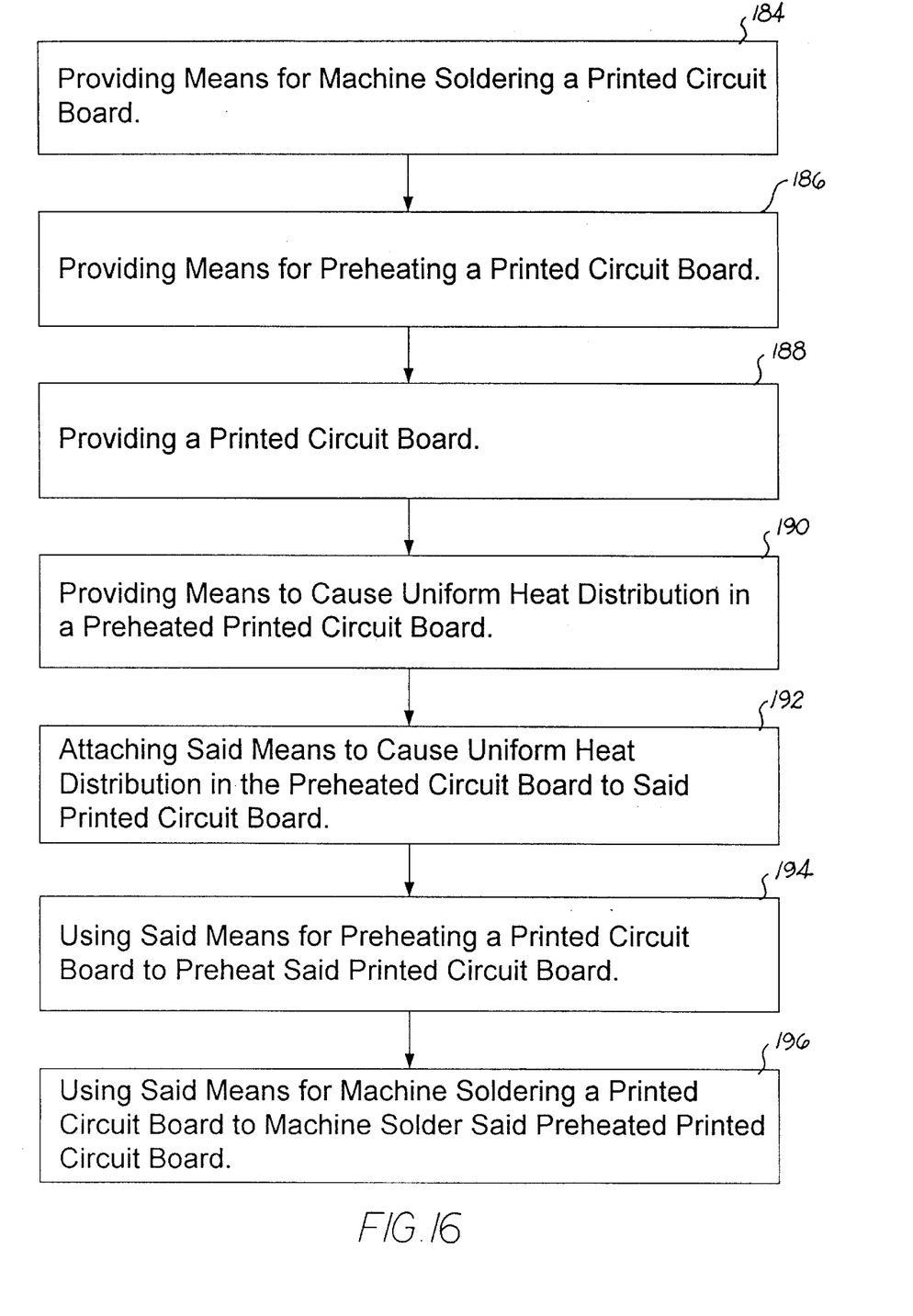
FIG. 16 is a block diagram of the steps for carrying out the circuit board manufacturing method invention.

The printed circuit boards 78, 136, 140, and 152 are manufactured and the method of manufacturing printed circuit boards are carried out in the following manner. The basic steps in carrying out the method of manufacturing printed circuit boards are illustrated in FIG. 16. As indicated in FIG. 16, the method of manufacturing a printed circuit board comprises the steps indicated in the block diagram of FIG. 16 including providing means for machine soldering a printed circuit board 184, providing means for preheating a printed circuit board 186 and providing a printed circuit board 188. This method also includes the step of providing means to cause uniform heat distribution in a preheated printed circuit board 190. These steps are followed by the steps of attaching the means to cause uniform heat distribution in the preheated printed circuit board to said preheated printed circuit board 192, using the means for preheating a printed circuit board to preheat the printed circuit board 194 and using the means for machine soldering a printed circuit board to machine solder the preheated printed circuit board 196.

With respect to the above indicated method, the step of providing means for machine soldering a printed circuit board 184 utilizes conventional known machine soldering equipment (not shown) that is well known in the art and hence is not described. In a similar manner, the step of providing means for preheating a printed circuit board 186 utilizes conventional printed circuit preheating equipment (not shown) that is well known in the art.

With respect to the step of providing a printed circuit board 188 this means providing the following with respect to the previously described embodiments 78, 136, 140 and 152. With respect to the printed circuit embodiment 78, as indicated previously the printed circuit board 78 comprises seven layers of polyimide material designated by the numbers 80, 82, 84, 86, 88, 90 and 92 with six thin copper layers 94, 96, 98, 100, 102 and 104 located between the respective polyimide layers 80 and 82, 82 and 84, 84 and 86, 86 and 88, 88 and 90, and 90 and 92. The upper surface 106 of the upper polyimide layer 80 is substantially covered by a thin copper layer 108. This copper layer 108 is then substantially covered by "B" stage polyimide material designated by the number 110 that even covers some of the holes 112, 114, 116, and 118 whose insides are covered by the respective copper coatings 120, 122, 124 and 126. The holes 120 and 124 are component lead holes and are not covered. The outer surface 128 that is substantially covered by a thin layer of copper 130 that in turn is substantially covered by a layer of "B" stage polyimide material 132 that also covers the holes 120 and 124. Consequently, both the top and bottom of the printed circuit board 78 have "B" stage polyimide over copper and are substantially identical in their configurations.

The printed circuit board embodiment 136 is illustrated in FIGS. 6 and 7 and as indicated previously it is substantially the same as the embodiment 78 illustrated in FIGS. 3, 4, and 5 and has all the same layers that are configured the same and hence numbered the same as those of the embodiment 78 set forth in FIGS. 3, 4, and 5. However, the printed circuit embodiment 136 does not have the "B" stage material layer 132 on the underside copper layer 130. Instead, the copper layer 130 is exposed.

The printed circuit board embodiment 140 is illustrated in FIGS. 8, 9 and 10 and as previously indicated it has substantially the same basic structure as the printed circuit embodiment 78 set forth in FIGS. 3, 4, and 5. However, both the upper and undersides of the basic structure of the board 78 are coated with solder coating prior to applying "B" stage polyimide layers. In this connection in the embodiment 140 the copper layer 108 is covered by a solder coating layer 142 and in a similar manner the copper layer 130 is also covered by a solder coating layer 144. These solder coating layers 142 and 144 have their outer surfaces covered by respective layers of "B" stage material 146 and 148. These layers 146 and 148 not only cover the respective solder coating layers 142 and 144 but also the feed through holes 114 and 118.

The embodiment 152 is set forth in FIGS. 11 and 12 and and as indicated previously it is substantially identical to the embodiment 140 set forth in FIGS. 8. 9, and 10 including the solder coating layer 142 and the associated "B" stage material layer 146 that covers the solder coating layer 142. However, there is no covering "B" stage material layer 148 over the solder coating layer 144 on the lower or underside portion of the printed circuit board embodiment 152 as there was with the embodiment 140.

The step of providing means to cause uniform heat distribution in a preheated circuit board 190 includes providing a "B" stage polyimide material that is a high temperature polyimide semicured material that is also specified in U. S. Military Specification MIL-S-13949H dated 31 Mar. 1993 that is incorporated herein by reference.

The step of attaching the means to cause uniform heat distribution in the preheated printed circuit board to the printed circuit board 192 includes cutting the "B" stage polyimide material as required either manually or by machine as is well known in the art and then manually or by machine pressing it onto the printed circuit board in a manner that is well known in the art. The final steps of using the means for preheating a printed circuit board to preheat the printed circuit board 194 followed by using the means for machine soldering a printed circuit board to machine solder the preheated printed circuit board 196 are in themselves both conventional steps well known in the art and hence need not be described.

Figure 17:
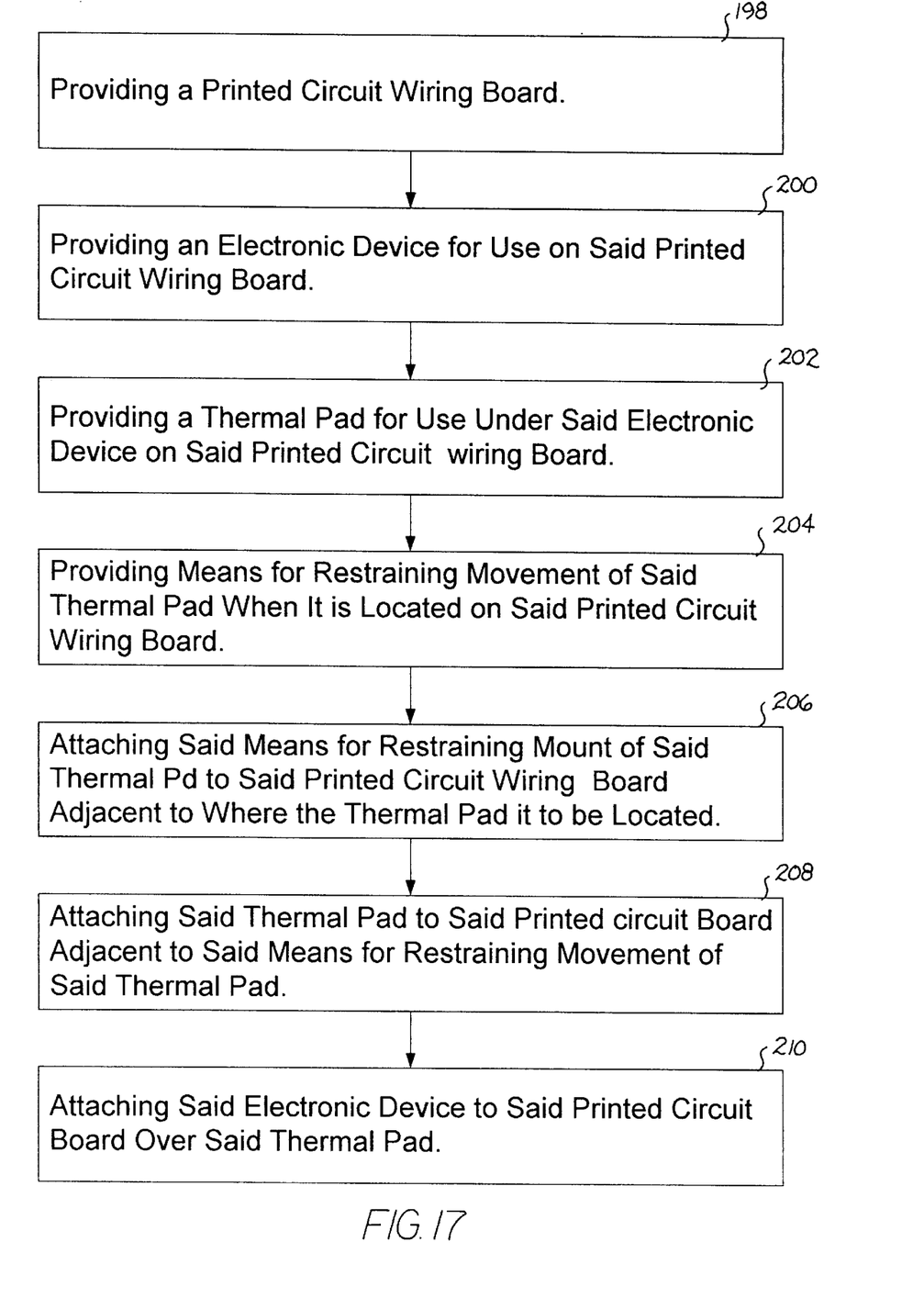
FIG. 17 is a block diagram of the steps for carrying out another embodiment of the circuit board manufacturing method invention.

FIG. 17 illustrates in block diagram form the steps of another embodiment of the circuit board manufacturing method of the invention that is related to the printed circuit board 162 illustrated in FIGS. 15 and 16. As illustrated in FIG. 17, the printed circuit board manufacturing method comprises the steps of providing a printed circuit board 198, providing an electronic device for use on the printed circuit board 200, providing a thermal pad for use under the electronic device on the printed circuit board 202 and providing means for restraining movement of the thermal pad when it is located on the printed circuit wiring board 204. The printed circuit board manufacturing method in FIG. 17 further comprises the steps of attaching the means for restraining movement of the thermal pad to the printed circuit board adjacent to where the thermal pad is to be located 206, attaching the thermal pad to the printed circuit board adjacent to the means to restrain movement of the thermal pad 208 and then attaching the electronic device to the printed circuit board over the thermal pad 210.

All of the materials used in the manufacture of the printed circuit boards designated by the numbers 78, 136, 140, 152 and 162 set forth in the relevant FIGS. 3 through 12 and 15 and 16 are conventional, except for the "B" stage material. As previously indicated, the "B" stage material is a high temperature semicured polyimide material.

After the printed circuit boards designated by the numbers 78, 136, 140 and 152 set forth in the relevant FIGS. 3 through 12 are manufactured they are all used in a conventional manner. However, they are very likely to have very few defects as compared to printed circuit boards manufactured by conventional techniques without the important use of "B" stage polyimide material.

Although the invention has been described in considerable detail with reference to certain preferred embodiments, it will be understood and appreciated that various modifications, substitutions and variations may be made without departing from the spirit and scope of the invention as described in the appended claims.

What is claimed is:

1. A method of manufacturing a machine soldered printed circuit board with printed circuit board preheating prior to machine soldering of the printed circuit board to provide for heat retardation to alleviate the problem of hot and cold spots on the printed circuit board during the preheating prior to machine soldering of the printed circuit board comprising the steps of:

providing an un-machine soldered printed circuit board having two sides and holes therethrough with one side having a copper layer thereon;

providing a "B" stage semicured polyimide material;

attaching said "B" stage semicured polyimide material to the entire exposed surface portion of said copper layer provided on said one side of said un-machine soldered printed circuit board including said holes prior to providing means for preheating the printed circuit board; providing means for machine soldering the printed circuit board; preheating;

using said means for preheating to preheat said un-machine soldered printed circuit board with said "B" stage semicured polyimide material, said semicured polyimide material serves as a heat retardation means to force heat into said holes in said un-machine soldered printed circuit board, thereby causing heat radiating from said holes to be at substantially the same temperature; and using said means for machine soldering a printed circuit board to machine solder on said preheated un-machine soldered printed circuit board.

2. A method of manufacturing a machine soldered printed circuit board with printed circuit board preheating prior to machine soldering of the printed circuit board to provide for heat retardation to alleviate the problem of hot and cold spots on the printed circuit board during the preheating prior to machine soldering of the printed circuit board comprising the steps of:

providing an un-machine soldered printed circuit board having two sides and holes therethrough with one side having a solder coating layer thereon;

providing a "B" stage semicured polyimide material;

attaching said "B" stage semicured polyimide material to the entire exposed surface portion of said solder coating layer provided on said one side of said un-machine soldered printed circuit board including said holes prior to providing means for preheating the printed circuit board; providing means for machine soldering the printed circuit board; preheating;

using said means for preheating to preheat said un-machine soldered printed circuit board with said "B" stage semicured polyimide material, said semicured polyimide material serves as a heat retardation means to force heat into said holes in said un-machine soldered printed circuit board, thereby causing heat radiating from said holes to be at substantially the same temperature; and using said means for machine soldering a printed circuit board to machine solder on said preheated un-machine soldered printed circuit board.

3. A method of manufacturing a machine soldered printed circuit board with printed circuit board preheating prior to machine soldering of the printed circuit board to provide for heat retardation to alleviate the problem of hot and cold spots on the printed circuit board during the preheating prior to machine soldering of the printed circuit board comprising the steps of:

providing an un-machine soldered printed circuit board having two sides and holes therethrough;

providing a "B" stage semicured polyimide material;

attaching said "B" stage semicured polyimide material to the entire exposed surface portion of said two sides of said un-machine soldered printed circuit board including said holes prior to providing means for preheating the printed circuit board; providing means for machine soldering the printed circuit board; preheating;

using said means for preheating to preheat said un-machine soldered printed circuit board with said "B" stage semicured polyimide material, said semicured polyimide material serves as a heat retardation means to force heat into said holes in said un-machine soldered printed circuit board, thereby hereby causing heat radiating from said holes to be at substantially the same temperature; and using said means for machine soldering a printed circuit board to machine solder on said preheated un-machine soldered printed circuit board.

* * * * *